United States Patent
Nishiwaki et al.

(10) Patent No.: US 6,921,941 B2
(45) Date of Patent: Jul. 26, 2005

(54) HIGH WITHSTAND VOLTAGE FIELD EFFECT SEMICONDUCTOR DEVICE WITH A FIELD DISPERSION REGION

(75) Inventors: Katsuhiko Nishiwaki, Toyota (JP); Tomoyoshi Kushida, Seto (JP); Sachiko Kawaji, Owariasahi (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/777,153

(22) Filed: Feb. 13, 2004

(65) Prior Publication Data

US 2004/0164349 A1 Aug. 26, 2004

(30) Foreign Application Priority Data

Feb. 26, 2003 (JP) ........................... 2003-049035

(51) Int. Cl.[7] .............................. H01L 29/73
(52) U.S. Cl. ......................................... 257/330
(58) Field of Search ................. 257/327, 328, 257/329, 330, 331, 332, 333, 334

(56) References Cited

U.S. PATENT DOCUMENTS 5,751,024 A * 5/1998 Takahashi

FOREIGN PATENT DOCUMENTS

JP 9-283754 10/1997

* cited by examiner

Primary Examiner—Nathan J. Flynn
Assistant Examiner—Kevin Quinto
(74) Attorney, Agent, or Firm—Finnegan, Henderson, Farabow, Garrett & Dunner, LLP

(57) ABSTRACT

It is intended to provide a high withstand voltage field effect type semiconductor device that relaxes electric fields in a semiconductor substrate without thickening thickness of a drift region and achieves withstand-ability against high voltage without sacrificing ON-voltage, switch-OFF characteristics, and miniaturization. A field effective type semiconductor device comprises emitter regions 100, 104 and gate electrodes 106 and the like on a surface (upper surface in FIG. 2), a collector region 101 and the like on the other surface (lower surface in FIG. 2), wherein N$^-$ field dispersion regions 111 of low impurity concentration are arranged between P body regions 103 facing to gate electrodes 106 and an N drift region 102 below P body regions 103. Thereby, electric field between collector and emitter is relaxed and high withstand voltage field effect type semiconductor device is realized. Another field dispersion region can be arranged between the N drift region 102 and P$^+$ collector region 101 below the N drift region 102.

17 Claims, 10 Drawing Sheets

HIGH WITHSTAND VOLTAGE FIELD EFFECT SEMICONDUCTOR DEVICE WITH A FIELD DISPERSION REGION

BACKGROUND OF THE INVENTION

1. Field of the Invention

The present invention relates to a field effect type semiconductor device provided with a body region that receives field effect of a gate electrode and a drift region arranged below the body region. More particularly, it relates to a high withstand voltage field effect type semiconductor device that achieves to enhance withstand-ability against higher voltage without sacrificing ON-voltage.

2. Description of Related Art

There have conventionally been used field effect type semiconductor devices for power devices (for example, JP Laid-open Patent Publication 09-283754, and the like). This type of field effect type semiconductor device has structure such as shown in FIG. 20, in general. A sectional view of a portion E—E is substantially same as FIG. 1 of which numberings are changed from "1" to "9". Hereinafter, numbering should be interpreted like that when FIG. 1 is referred in the description of related art. FIG. 20 is a sectional view of a portion A—A in FIG. 1. This field effect type semiconductor device has trench type gate electrodes 906. Roughly speaking, the field-effect-type semiconductor device is structured such that emitter regions (900, 904) and gate electrodes 906 are arranged at a surface side of its semiconductor substrate (upper side in FIG. 20) and a collector region 901 is arranged at the reverse side (lower side in FIG. 20).

That is, there are arranged trench type gate electrodes 906, P$^+$ emitter regions 900, and N$^+$ emitter regions 904 at the surface side of the semiconductor substrate. Each gate electrode 906 is insulated from the semiconductor substrate by a gate dielectric 905 and an interlayer dielectric 907. An emitter electrode 909 is arranged above the interlayer dielectric 907. The emitter electrode 909 is in contact with the semiconductor substrate at contact openings 908, zonal portions in parallel to gate electrodes 906 in FIG. 1. Therefore, the emitter electrode 909 is in contact to both P$^+$ emitter regions 900 and N$^+$ emitter regions 904. P channel regions 903 are arranged below those emitter regions. Bottom level of P body regions 903 is shallower than that of gate electrodes 906.

An N drift region 902 is formed below P channel regions 903. Most part of the N drift region 902 is deeper than the bottom level of gate electrodes 906 and extends to almost entire plane of the semiconductor substrate. A P$^+$ collector region 901 is arranged further below the N drift region 902. A collector electrode 910 is formed in contact with the bottom portion of the P$^+$ collector region 901. In this field effect type semiconductor device, field effect is induced at P body regions 903 by applying voltage to gate electrodes 906 to control conduction between the emitter electrode 909 and the collector electrode 910.

However, the above-described conventional field-effect-type semiconductor device has had following problems. That is, in case it is intended to enhance withstand-ability against high voltage between an emitter and a collector, thickness of the N drift region 902 (represented as "T" in FIG. 20) must be made thick. Thereby, an electric field of the P body region 903 and N drift regions 902 is relaxed and withstand-ability against high voltage can be achieved. However in this case, parasitic resistance of N drift region 902 is large in proportion to thickness. This also means ON-voltage is high in proportion to it. Furthermore, amount of carriers remaining in the N drift region 902 after switch-OFF is large in proportion to it. This means turn-OFF time is long. Lengthy turn-OFF time itself means poor operating ability and large switching loss. Therefore, there is a fear of device destruction due to heat. For avoiding such device destruction, device size had to be large so as to decrease current concentration.

SUMMARY OF THE INVENTION

The present invention has been made in order to solve the foregoing problem. It is an object of the present invention to provide a high withstand voltage field effect type semiconductor device that relaxes electric fields in a semiconductor substrate without thickening a drift region and achieves withstand-ability against high voltage without sacrificing ON-voltage, switch-OFF characteristics, and miniaturization.

To resolve the conventional problem, there is provided a high withstand voltage field effect type semiconductor device comprising: a body region arranged in a semiconductor substrate; a gate electrode facing to the body region; a drift region arranged below the body region in the semiconductor substrate, the drift region being in conduction type opposite to the body region; and a field dispersion region arranged between the body region and the drift region, the field dispersion region being in conduction type same as the drift region and having low net impurity concentration. In this application, "semiconductor substrate" refers to a monocrystal silicon layer of a semiconductor supplied as a wafer in general, and in case a semiconductor layer is formed on a semiconductor substrate by epitaxial growth technology or the like, it refers to the entirety of the substrate and the layer formed thereon.

According to the inventive high withstand voltage field effect type semiconductor device, electrical conduction in a semiconductor substrate is controlled by using field effect obtained by applying voltage to a gate electrode. In the inventive high withstand voltage field effect type semiconductor device, there is arranged a field dispersion region between a body region and a drift region wherein conduction type of the field dispersion region is same as that of the drift region and net impurity concentration of it is lower than that of the drift region. Therefore, a depletion layer is likely to extend toward the field dispersion region from a PN junction of the body region and the field dispersion region immediately after switch-OFF. Therefore, electric field applied to the body region and the drift region is relaxed. Accordingly, withstand-ability against voltage between the body region and the drift region is high. It is not particularly necessary to thicken thickness of the drift region or to enlarge device size. Therefore, ON-voltage, switch-OFF characteristics, compact design of the device are not sacrificed.

DETAILED DESCRIPTION OF PREFERRED EMBODIMENTS

Embodiments of the present invention will be described by referring to drawings.

[First Embodiment]

Figure 1:
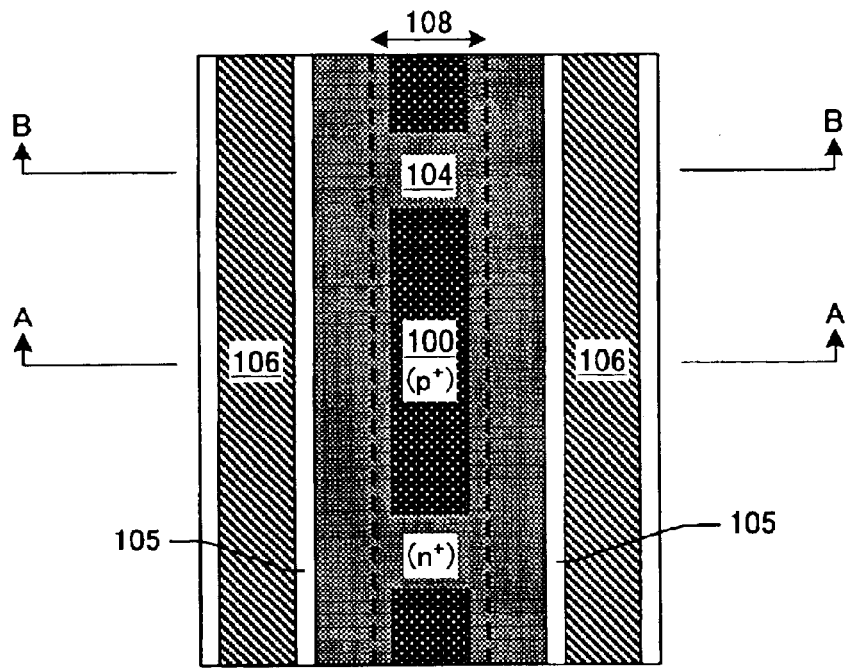
FIG. 1 is a plane sectional view (a portion E—E) showing structure of a field effect type semiconductor device directed to a first embodiment.
Figure 2:
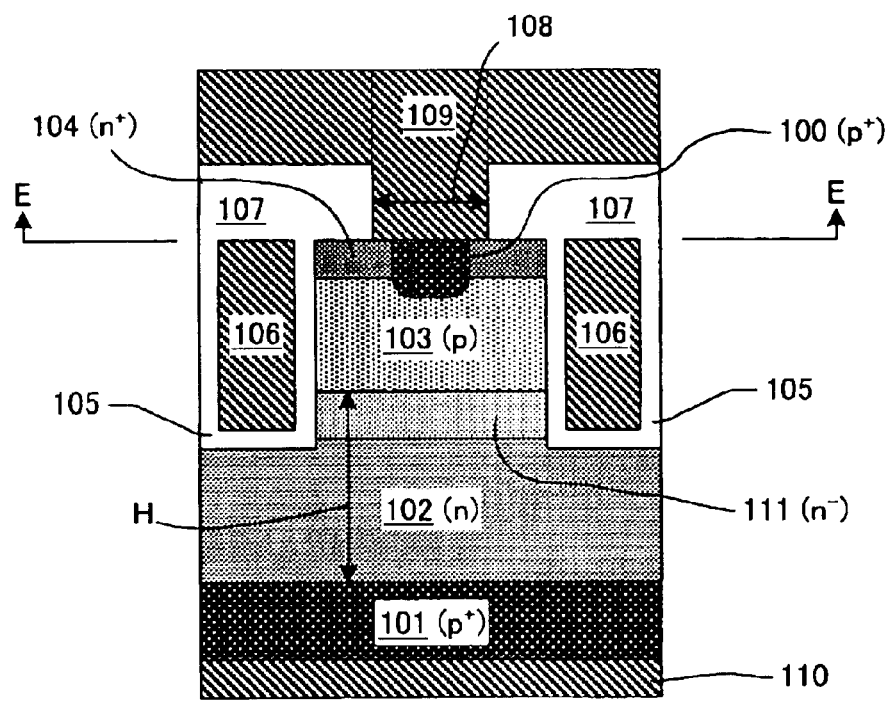
FIG. 2 is an elevation sectional view (a portion A—A) showing structure of the field effect type semiconductor device directed to the first embodiment.
Figure 3:
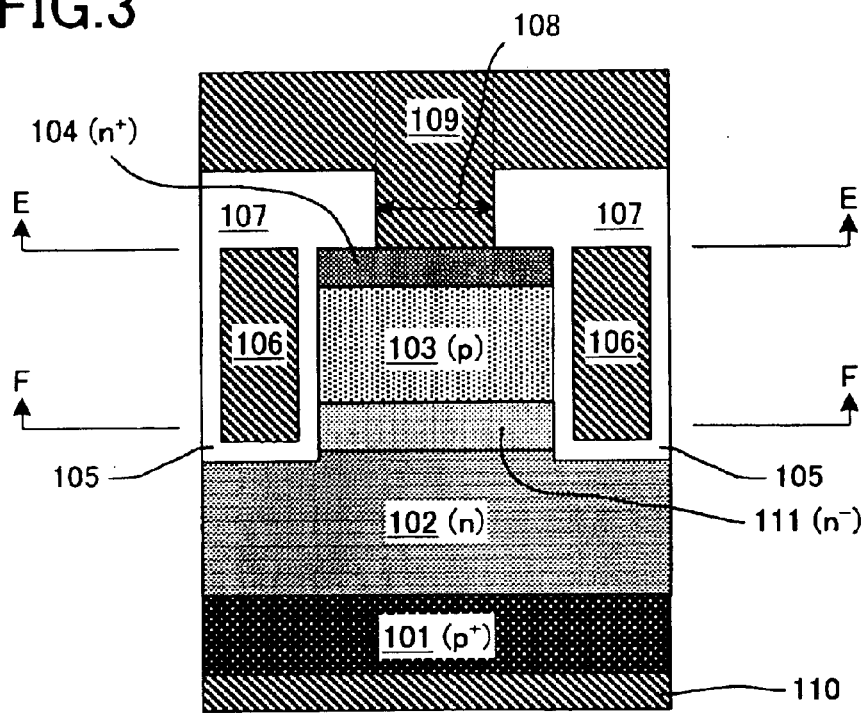
FIG. 3 is an elevation sectional view (a portion B—B) showing structure of the field effect type semiconductor device directed to the first embodiment.

FIG. 1 through FIG. 3 show structure of a high withstand voltage field effect type semiconductor device directed to a first embodiment. FIG. 2 shows a sectional view of a portion A—A in FIG. 1. FIG. 3 shows a sectional view of a portion B—B in FIG. 1. FIG. 1 shows a sectional view of a portion E—E (this level is termed as "surface" in this specification) in FIG. 2 and in FIG. 3. This high withstand voltage field effect type semiconductor device is so-called an insulated gate-type bipolar transistor (IGBT) and has trench-structured gate electrodes 106. Roughly speaking, this high withstand voltage field effect type semiconductor device is structured such that $N^+$ emitter regions 100, 104 and gate electrodes 106 are arranged on a surface of a semiconductor substrate (upper side in FIG. 2 and in FIG. 3) and a $P^+$ collector region 101 and the like are arranged on other face of the substrate (bottom side in FIG. 2 and in FIG. 3).

That is, $P^+$ emitter regions 100 and $N^+$ emitter regions 104 as well as trench-structured gate electrodes 106 are arranged on a surface of the semiconductor substrate. Each gate electrode 106 is insulated from the substrate by a gate dielectric 105 and an interlayer dielectric 107. Beneath $P^+$ emitter regions 100 and $N^+$ emitter regions 104, there are arranged P body regions 103 that face to gate electrodes 106 via gate dielectrics 105 at left and right sides. Bottom level of P channel regions 103 is shallower than that of gate electrodes 106. Above $P^+$ emitter regions 100, $N^+$ emitter regions 104, and gate electrodes 106, there is arranged an emitter electrode 109. The emitter electrode 109 is in contact with the semiconductor substrate at contact openings 108. In detail, the emitter electrode 109 is in contact with both a $P^+$ emitter region 100 and an $N^+$ emitter region 104 in FIG. 2 (portion A—A), and is in contact with an $N^+$ emitter region 104 in FIG. 3 (portion B—B).

Both in FIG. 2 and in FIG. 3, an $N^-$ field dispersion region 111 is formed below each P body region 103. Bottom level of $N^-$ field dispersion regions 111 is shallower than that of gate dielectrics 105. An N drift region 102 is formed below $N^-$ field dispersion regions 111. Impurity concentration at $N^-$ field dispersion regions 111 is same as or lower than 80% of impurity concentration at the N drift region 102. Impurity concentration at $N^-$ field dispersion regions 111 may be low as so-called i-type, but should not be P-type. Thickness of $N^-$ field dispersion regions 111 is slightly thicker than 1 $\mu$m. Most part of the N drift region 102 is deeper than bottom level of gate dielectrics 105 and substantially extends to the entirety of the semiconductor substrate. Further below the N drift region 102, a $P^+$ collector region 101 is arranged. Further below the $P^+$ collector region 101, a collector electrode 110 is formed.

As shown in FIG. 1, in the high withstand field effect type semiconductor device of the present embodiment, gate electrodes 106 are arranged in a vertically-striped pattern in FIG. 1. Band areas between adjoining gate electrodes 106 are provided as $N^+$ emitter regions 104. Contact openings 108 are narrower than a width of $N^+$ emitter regions 104. Furthermore, $P^+$ emitter regions 100 are arranged in contact openings 108 insularly.

In the high withstand voltage field effect type semiconductor device of the present embodiment, current between the emitter electrode 109 and the collector electrode 110 is controlled by applying voltage to gate electrodes 106. That is, conduction type around the surfaces of P body regions 103 (surfaces that face to respective side walls of gate electrodes 106 in FIG. 2 and in FIG. 3) is reversed by voltage of gate electrodes 106, whereby current paths are formed. This is ON state. When gate voltage application is turned OFF, the high withstand voltage field effect type semiconductor device turns into OFF state. After switch-OFF, a depletion layer start extending from a PN junction between P body regions 103 and $N^-$ field dispersion regions 111. N-type semiconductor region in contact with the PN junction corresponds to $N^-$ field dispersion regions 111 of which impurity concentration is low. Therefore, a depletion layer is likely to extend immediately after switch-OFF. Thereby, the following effect can be obtained. That is, even if gate voltage is turned OFF, voltage is kept being applied between the emitter electrode 109 and the collector electrode 110. Since a depletion layer is likely to extend immediately after switch-OFF, intensity of electric field in the semiconductor substrate is relaxed.

Figure 4:
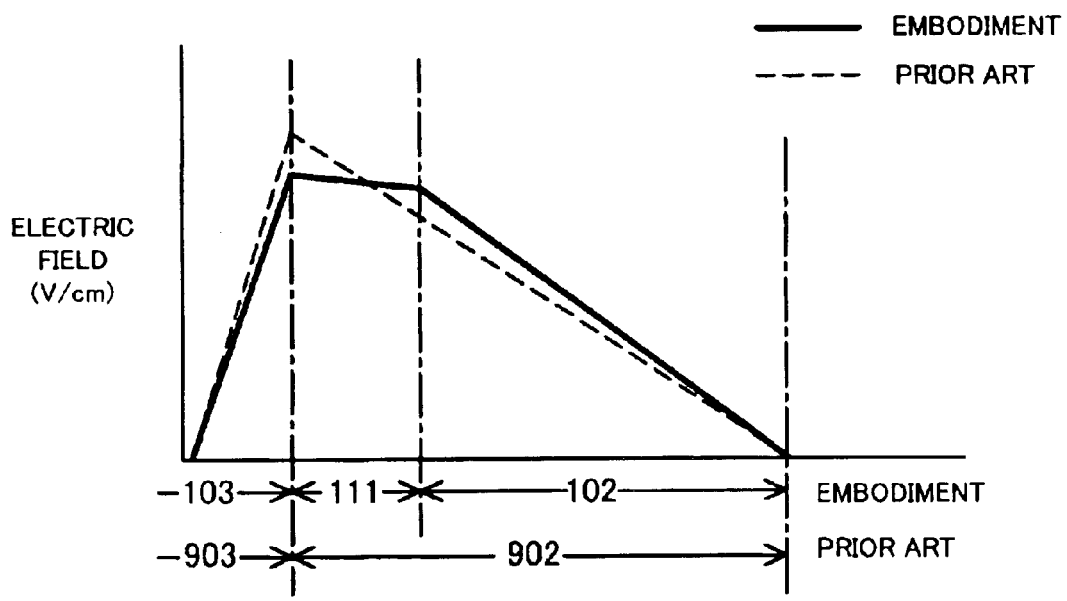
FIG. 4 is a graph showing electric field distribution in semiconductor substrate after switch-OFF in comparison with the first embodiment and a conventional one.
Figure 20:
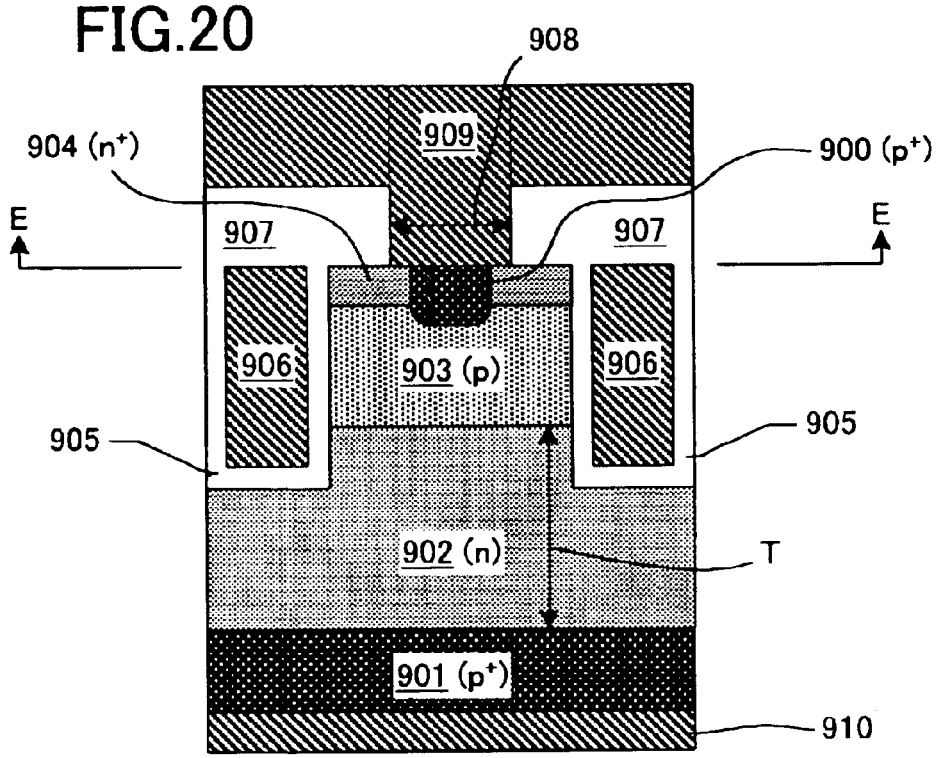
FIG. 20 is an elevation sectional view (a portion A—A) showing structure of a conventional field effect type semiconductor device.

FIG. 4 is a graph relating to distribution of electric field at a P body region 103, an N⁻ field dispersion region 111, and the N drift region 102. In this graph, distribution of electric field with respect to prior art is shown for making comparison. As to the prior art represented with broken line, electric field intensity peaks at border of the P body region 903 and the N drift region 902. On the other hand, as to the high withstand voltage field effect type semiconductor device of the present embodiment represented with continuous line, a peak value of field electric intensity is low due to electric field relaxation effect at N⁻ field dispersion regions 111. Therefore, in this high withstand voltage field effect type semiconductor device, withstand-ability against collector-emitter voltage is high even though the N drift region 102 is not so thick. To be more specific, total thickness H of the N drift region 102 and the N⁻ field dispersion region 111 may be thick enough even if it is thinner than thickness T of the N drift region 902 in FIG. 20.

Figure 5:
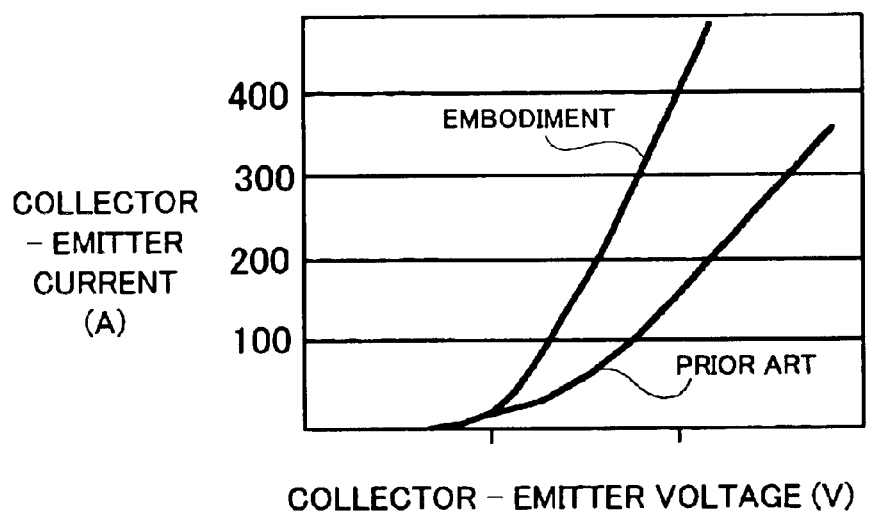
FIG. 5 is a graph showing relation of collector-emitter voltage and collector-emitter current in the field effect type semiconductor device directed to the first embodiment in comparison with conventional one.

Furthermore, since thickness of the N drift region 102 can be made thin, ON-voltage is low, which is an advantageous aspect. FIG. 5 is a graph showing relation of collector-emitter voltage and collector-emitter current in the high withstand voltage field effect type semiconductor device directed to the present embodiment in comparison with conventional one. The conventional one in FIG. 5 has an N drift region 902 thickened sufficiently to withstand against voltage as high as voltage the present embodiment withstands against. It is apparent from this graph that the high withstand voltage field effect type semiconductor device of the present embodiment requires low collector-emitter voltage in comparison with the conventional one.

There will be described manufacturing process of the high withstand voltage field effect type semiconductor device directed to the present embodiment by referring to FIG. 6 through FIG. 9. For manufacturing the high withstand voltage field effect type semiconductor device directed to the present embodiment, it is assumed that a P⁺ silicon wafer is a start substrate. The P⁺ silicon of the wafer corresponds to a P⁺ collector region 101. An N-type silicon layer is formed on the surface of the wafer by epitaxial growth. This N-type silicon layer corresponds to an N drift region 102. In the present invention, the entirety of the silicon wafer and semiconductor layers formed thereon is termed as "semiconductor substrate". Or alternatively, an N-type silicon wafer can be a start substrate. In that case, N-type silicon of the wafer corresponds to an N drift region 102. A P⁺ collector region 101 can be formed by adding P-type impurity from the bottom side of the N-type silicon wafer or by depositing a P-type silicon layer on surface of the bottom side of the N-type silicon wafer.

Figure 6:
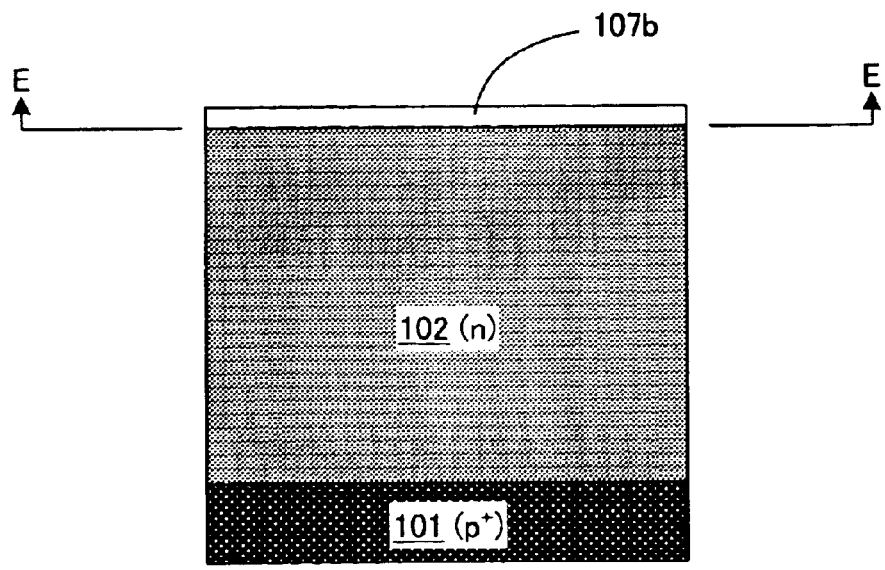
FIG. 6 is an elevation sectional view ((1), portion A—A and portion B—B) illustrating manufacturing process of the field effect type semiconductor device directed to the first embodiment.

Next, there is formed a thermal oxide film of which thickness is about 700 nm on the surface of N-type silicon layer by pyrogenic oxidation of 1000° C. Patterning of the thermal oxide film is made by photolithography and etching. Thereby, the thermal oxide film remains on a frame portion of the wafer. As a result, an opening where the N-type silicon layer appears is formed on the entirety of a portion on which devices are to be formed. Next, a thermal oxide film 107b is formed on the N-type silicon layer (N drift region 102) again. Heating temperature is 900° C. and thickness of the film is 18 nm. FIG. 6 shows a sectional view (portion A—A and portion B—B) of this stage.

Figure 7:
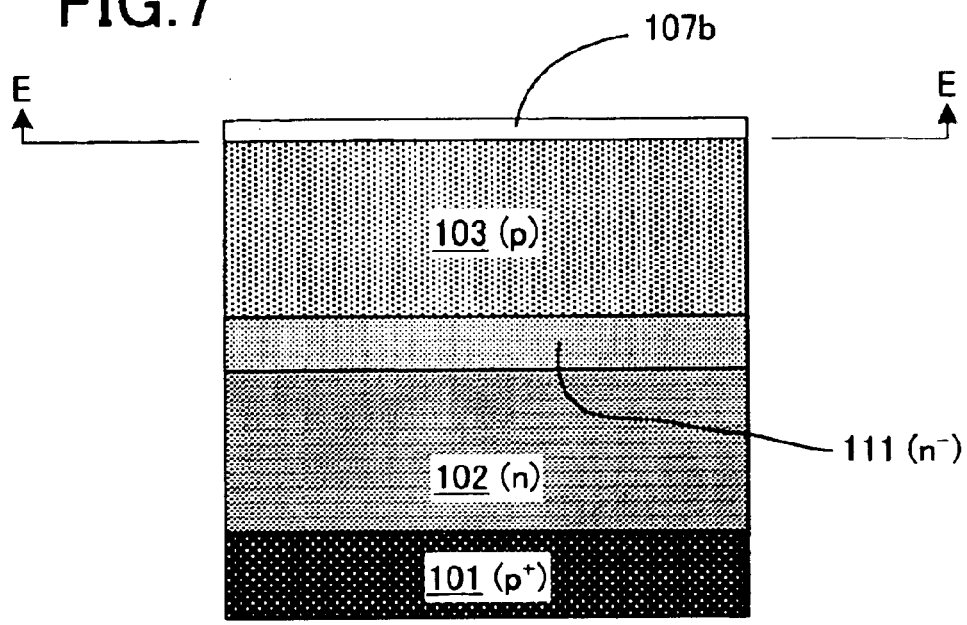
FIG. 7 is an elevation sectional view ((2), portion A—A and portion B—B) illustrating manufacturing process of the field effect type semiconductor device directed to the first embodiment.

Boron is injected by ion implantation of which accelerating voltage is 300 kV. This ion implantation is done for forming an N⁻ field dispersion region 111. Amount of dose is $1.0 \times 10^{11}$ cm⁻². This amount of dose is not so much as the extent that the N type silicon layer (N drift region 102) wherein injected boron is distributed is reversed to P-type. Net impurity concentration is a margin between donor concentration and acceptor concentration. Therefore, net impurity concentration of the N⁻ field dispersion region 111 is lower than that of the N drift region 102. Next, boron is further injected by ion implantation of which accelerating voltage is 60 kV. This ion implantation is done for forming a P body region 103. Amount of dose is $4.7 \times 10^{13}$ cm⁻². This amount of does is as much as the extent that the N type silicon layer (N drift region 102) wherein current injected boron is distributed is reversed to P-type. After that, under nitrogen atmosphere, diffusion of boron is made with 1150° C. of heat processing. Thereby, as shown in FIG. 7, a P body region 103 and an N⁻ field dispersion region 111 are formed. Depth of the P body region 103 is 5 µm. The N⁻ field dispersion region 111 is arranged immediately below the P body region 103 and thickness of it is slightly thicker than 1 µm.

It is to be noted that formation of an N⁻ field dispersion region 111 and a P body region 103 can be done by various methods other than the above-described method of modifying an N drift region 102 by ion implantation. For example, an N drift region 102, an N⁻ field dispersion region 111, and a P body region 103 may be formed in this order by changing components of impurity in order at the time of epitaxial growth. Alternatively, an N drift region 102 and an N⁻ field dispersion region 111 may be formed in order by means of epitaxial growth and a part of the N⁻ field dispersion region 111 may be modified by ion injection to form a P body region 103.

Figure 8:
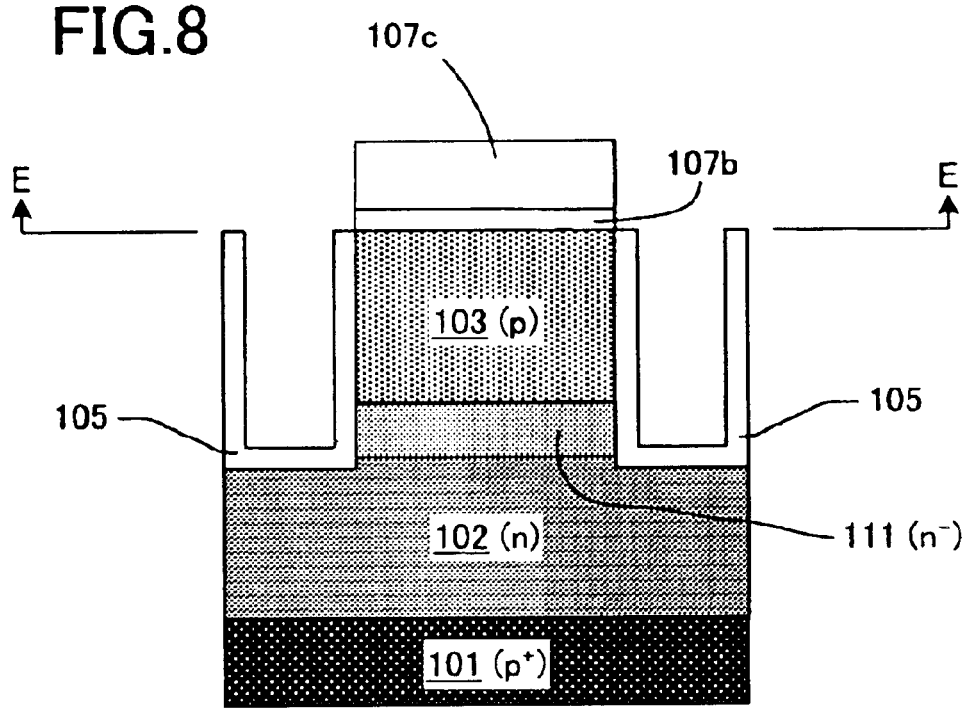
FIG. 8 is an elevation sectional view ((3), portion A—A and portion B—B) illustrating manufacturing process of the field effect type semiconductor device directed to the first embodiment.

Further on, an oxide film 107c is added on a thermal oxide film 107b by means of CVD method. Thickness of it is 400 nm. Then, pattern etching is made for the oxide films 107C and 107b. A pattern to be formed thereon is a pattern to take portions for electrodes 106 as openings. Remaining oxide films 107c and 107b are used for etching mask to form trenches. Silicon etching is made with the oxide film mask by means of RIE method. Thereby, there are formed trenches. Depth of them is slightly deeper than 6 µm and this is as deep as the extent that the N⁻ field dispersion region 111 thoroughly separated by the trenches. Etching is made on sidewalls of thus formed trenches by means of CDE method. After that, a thermal oxide film is formed on a surface of trenches with 1100° C. of heat processing and the oxide film is eliminated. Thereby, defects on sidewalls of trenches are eliminated. After that, a thermal oxide film of 100 nm thick is formed on a surface of trenches with 1100° C. of heat processing. This thermal oxide film corresponds to gate dielectrics 105. FIG. 8 shows a cross sectional view of the so far manufactured.

Next, a polycrystal silicon film of 800 nm thickness is formed by means of CVD method. Further on, 950° C. of heat processing is applied under phosphorous oxychloride atmosphere. Thereby, phosphorous is diffused into the polycrystal silicon film. After that, excessive polycrystal silicon and remaining oxide film mask are eliminated by means of photolithography and etching. Polycrystal silicon of a portion higher than the level of trench openings is to be eliminated. However, a polycrystal silicon portion that is used as wirings to gate electrodes 106 (the wiring is termed as "gate wiring" hereinafter) is left. Thereby, trench-structured gate electrodes 106 and wirings for them are formed. Next, a thermal oxide film is formed on surfaces of the P channel region 103 and the gate electrodes 106 under 950° C. of heat processing. Thickness of the film is 30 nm.

Boron is injected by ion implantation and phosphorus is further injected thereon by ion implantation. Ion implantation of boron is made for forming $P^+$ emitter regions 100. Therefore, this processing is conducted through an appropriate pattern mask under conditions of 70 kV of accelerating voltage and $4 \times 10^{15}$ cm$^{-2}$ of dose. Ion implantation of phosphorus is made for forming $N^+$ emitter regions 104. Therefore, this processing is conducted under conditions of 120 kV of accelerating voltage and $5 \times 10^{15}$ cm$^{-2}$ of dose. After that, a BPSG film thickness of which is 1.5 $\mu$m is formed on the latest oxide film. This BPSG film corresponds to an interlayer dielectric 107. After that, 950° C. of heat processing is made under nitrogen atmosphere. Thereby, the interlayer dielectric 107 is flattened and $P^+$ emitter regions 100 and $N^+$ emitter regions 104 are formed due to heat diffusion of chemical elements injected.

Figure 9:
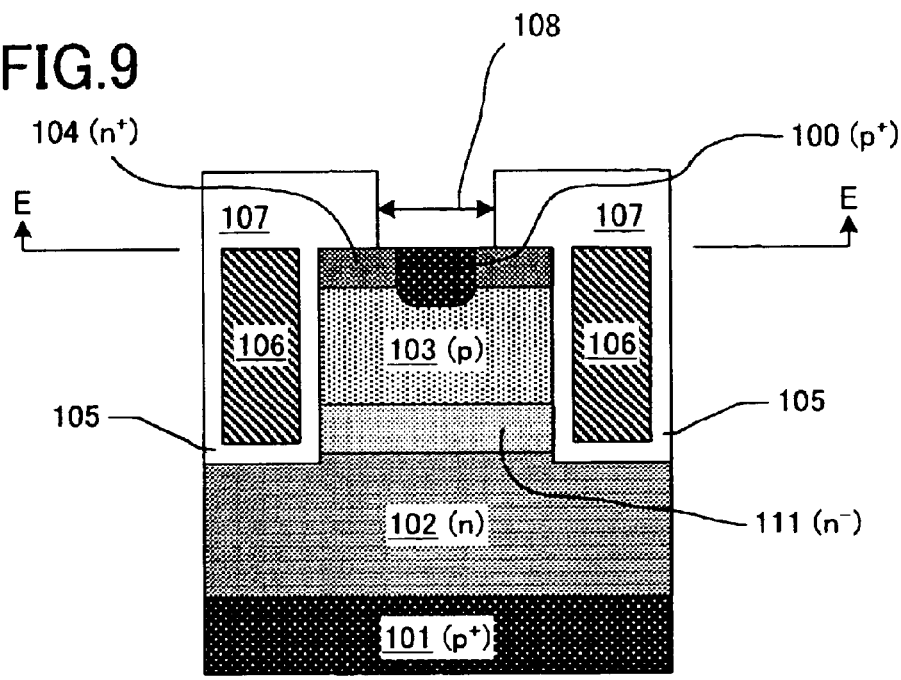
FIG. 9 is an elevation sectional view ((4), a portion A—A) illustrating manufacturing process of the field effect type semiconductor device directed to the first embodiment.

Next, patterning of an interlayer dielectric 107 is made by means of photolithography and etching. Thereby, an interlayer dielectric 107 is eliminated at portions corresponding to contact openings 108 and at portions where gate wirings are in contact with upper wiring. Thereby, $P^+$ emitter regions 100 and $N^+$ emitter regions 104 are made to appear within contact openings 108. FIG. 9 shows a cross sectional view of the portion A—A so far manufactured. Under this stage, contact portions of gate wirings are made to appear, as well. Further on, a barrier metal layer mainly made of titanium is formed on portions appearing from openings and remaining interlayer dielectric 107 and an aluminum/aluminium layer is piled above the barrier metal layer by means of sputtering methods. After that, patterning of the barrier metal layer and the aluminum/aluminium layer is made by means of photolithography and etching (wet etching and RIE). Thereby, an emitter electrode 109 is formed. Furthermore, upper wirings for gate wirings are formed, as well. Next, a collector electrode 110 is formed on the bottom face of the $P^+$ collector region 101 by means of sputtering method. Thereby, a high withstand voltage field effect type semiconductor device of the present embodiment is completed.

In case an N-type silicon wafer is a start substrate, structure of an emitter side (gate electrodes 106, $P^+$ emitter regions 100, $N^+$ emitter regions 104, and an emitter electrode 109, and the like) can be formed firstly and formation of a $P^+$ collector region 101 can come next.

As described, the high withstand voltage field effect type semiconductor device of the present embodiment has $N^-$ field dispersion regions 111 between P body regions 103 and an N drift region 102, wherein electrical resistance of $N^-$ field dispersion regions 111 is higher than that of the N drift region 102. Thereby, relaxation of electric field in a semiconductor substrate after switch-OFF is intended. Thickness of $N^-$ field dispersion regions 111 is more than 1 $\mu$m in the present embodiment, while too thin $N^-$ field dispersion region cannot obtain enough effect. Accordingly, there is realized a high withstand voltage field effect type semiconductor device that compromises high withstand against collector-emitter voltage and low ON-voltage.

[Second Embodiment]

Figure 10:
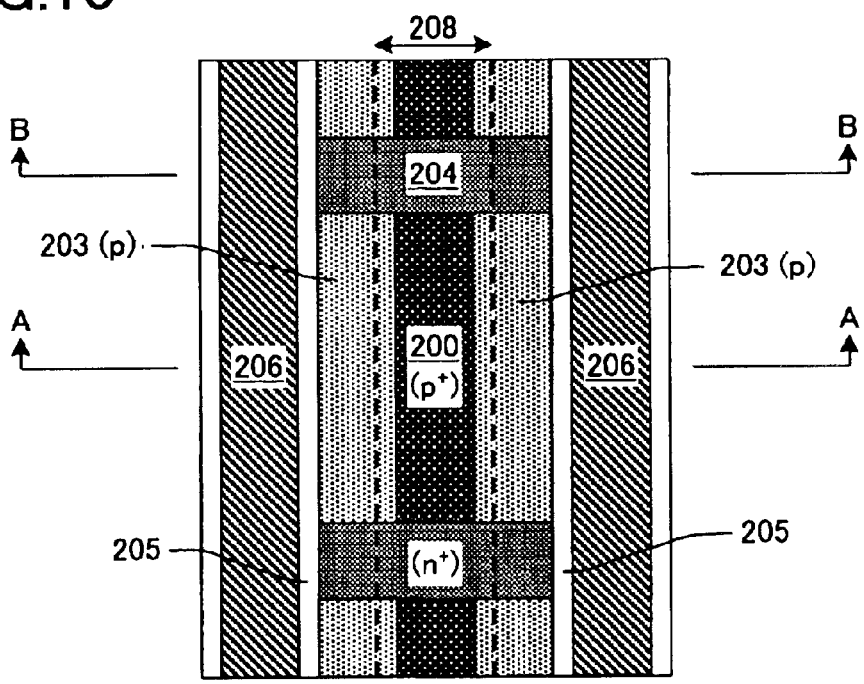
FIG. 10 is a plane sectional view (a portion E—E) showing structure of a field effect type semiconductor device directed to a second embodiment.
Figure 11:
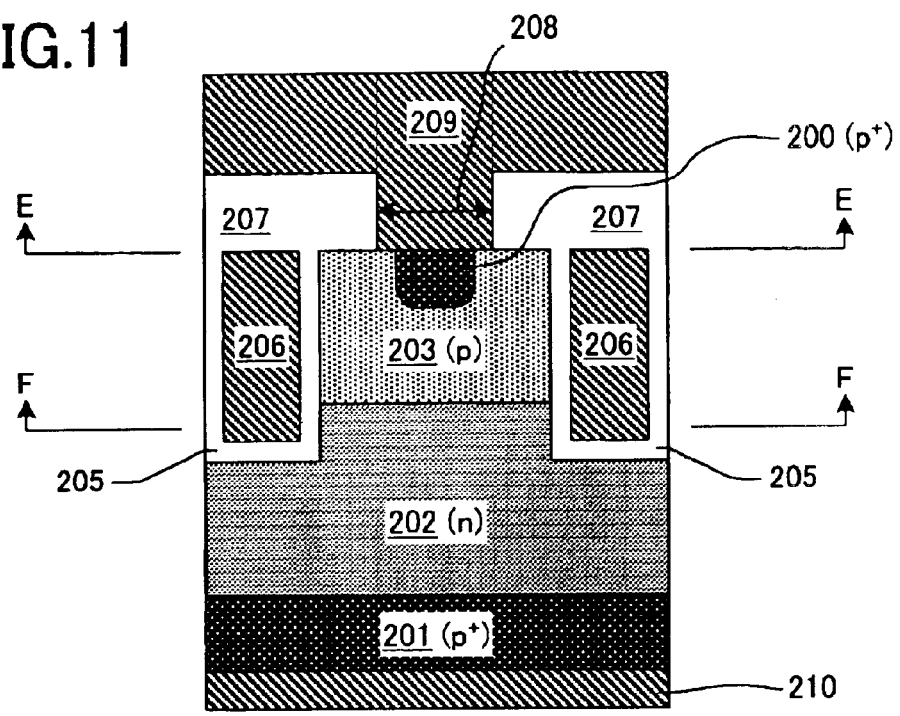
FIG. 11 is an elevation sectional view (a portion A—A) showing structure of the field effect type semiconductor device directed to the second embodiment.
Figure 12:
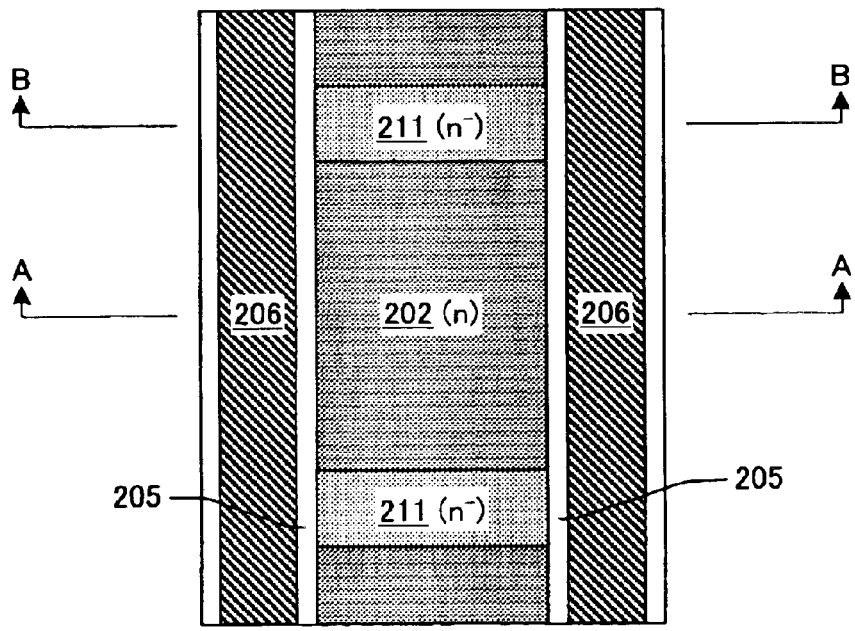
FIG. 12 is a plane sectional view (a portion F—F) showing structure of the field-effect-type semiconductor device directed to the second embodiment.

FIG. 10 through FIG. 12 show structure of a high withstand voltage field effect type semiconductor device directed to a second embodiment. FIG. 11 shows a sectional view of a portion A—A in FIG. 10 and in FIG. 12. FIG. 10 shows a sectional view of a portion E—E in FIG. 11. FIG. 12 shows a sectional view of a portion F—F in FIG. 11. Furthermore, the sectional view of the portion B—B in FIG. 10 and in FIG. 12 is substantially same as FIG. 3 for the first embodiment of which numberings are changed from "1" to "2". Hereinafter, numberings should be interpreted like that when FIG. 3 is referred in this embodiment. The high withstand voltage field effect type semiconductor device of this embodiment is common to the first embodiment in terms of being trench-gate type. Furthermore, except for structure of emitter portion and $N^-$ field dispersion region, other structure of it is same as the first embodiment. Furthermore, $P^+$ emitter regions 200 in its emitter portion are same as the first embodiment. Only the structure of $N^+$ emitter regions 204 and $N^-$ field dispersion regions 211 differs from the first embodiment.

With reference to the high withstand voltage field effect type semiconductor device of the present embodiment, those portions different from the first embodiment will be described. Firstly, the structure of $N^+$ emitter regions 204 will be described. As shown in FIG. 10, $N^+$ emitter regions 204 are arranged discretely and alternately with $P^+$ emitter regions 200 in vertical direction in FIG. 10. However, different from $P^+$ emitter regions 200, $N^+$ emitter regions 204 extend in an entire width from a gate dielectric 205 to a gate dielectric 205 of another gate electrode 206 in horizontal direction in FIG. 10. At the left and right sides of $P^+$ emitter region 200, a P body region 203 appears on the surface of the semiconductor substrate. Accordingly, in the high withstand voltage field effect type semiconductor device of the present embodiment, an emitter electrode 209 is in contact with P body regions 203, $P^+$ emitter regions 200, and $N^+$ emitter regions 204 at contact openings 208.

Next, $N^-$ field dispersion regions 211 will be described. As shown in FIG. 12, $N^-$ field dispersion regions 211 are arranged discretely like $N^+$ emitter regions 204. As shown in FIG. 11, there is no $N^-$ field dispersion region 211 below portions without an $N^+$ emitter region 204 (portion A—A). On the other hand, as shown in FIG. 3, an $N^-$ field dispersion region 211 is arranged below an $N^+$ emitter region 204.

Manufacturing process of the high withstand voltage field effect type semiconductor device of the present embodiment is similar to the first embodiment except for the following point. That is, in this embodiment, ion implantations for forming $N^-$ field dispersion regions 211 and for forming $N^+$ emitter regions 204 are done through appropriate pattern mask. This is to realize a discretely arranged pattern described in the above.

The above such structured high withstand voltage field effect type semiconductor device directed to the present embodiment has another effect in addition to effect obtained with the device of the first embodiment. That is, there are portions of high potential barrier against holes and portions of low potential barrier alternately at PN junction of collector side of P body regions 203 (bottom portion in FIG. 11 and the like). Portions of low potential barrier correspond to portions where $N^-$ field dispersion regions 111 are arranged. Portions of high potential barrier correspond to portions where P body regions 203 and an N drift region 202 are in contact with each other directly. Potential barrier is prevented from decline by these portions of high potential barrier. A $P^+$ emitter region 200 exists above a portion of high potential barrier. That is, level of potential barrier at collector side is heightened at a portion in which holes are taken to emitter side from a P body region 203. Thereby, rise of ON-voltage is avoided.

It is to be noted that vertical directional width of an $N^+$ emitter region 204 in FIG. 10 is not always required to be same as vertical directional width of an N⁻ field dispersion region 211 in FIG. 12. Therefore ON-voltage of a high withstand voltage field effect type semiconductor device can be controlled with width of an N⁻ field dispersion region 211, in terms of device design. Needless to say, this control can be done separately from high withstand voltage improvement.

[Third Embodiment]

Figure 13:
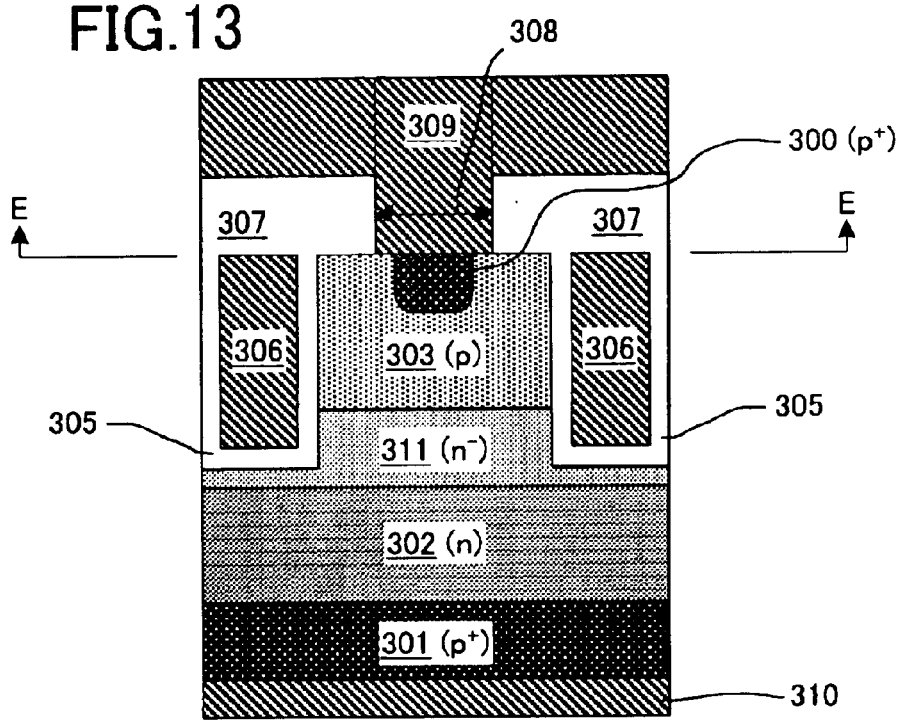
FIG. 13 is an elevation sectional view (a portion A—A) showing structure of a field effect type semiconductor device directed to a third embodiment.
Figure 14:
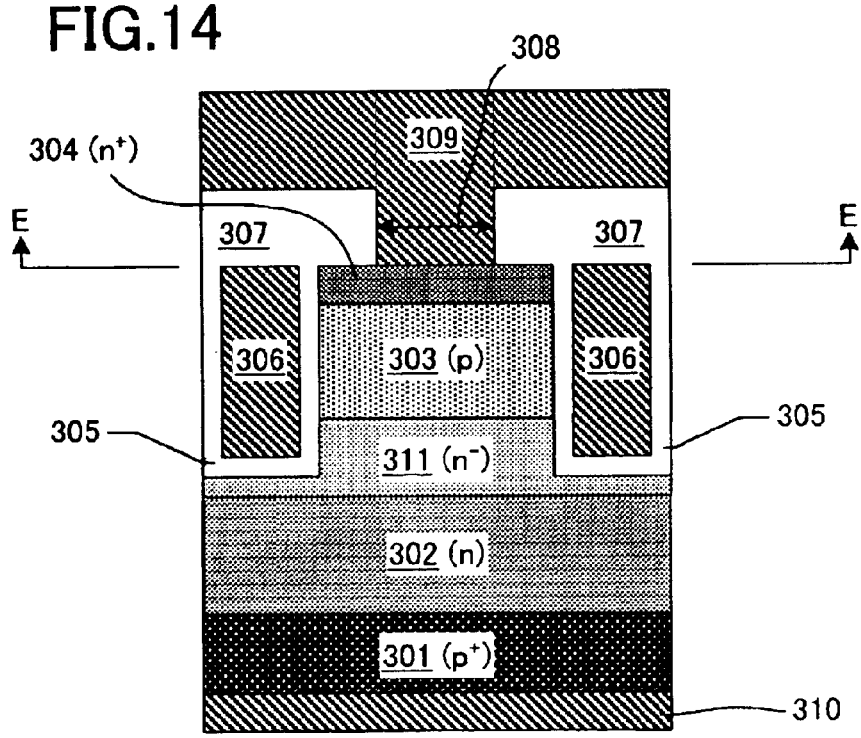
FIG. 14 is an elevation sectional view (a portion B—B) showing structure of the field effect type semiconductor device directed to the third embodiment.

FIG. 13 and FIG. 14 show structure of a high withstand voltage field effect type semiconductor device directed to a third embodiment. The sectional view of the portion E—E in FIG. 13 and in FIG. 14 is substantially same as FIG. 10 for the second embodiment of which numberings are changed from "2" to "3". Hereinafter, numberings should be interpreted like that when FIG. 10 is referred in this embodiment. FIG. 13 shows a sectional view of a portion A—A in FIG. 10. FIG. 14 shows a sectional view of a portion B—B in FIG. 10. The high withstand voltage field effect type semiconductor device of this embodiment is common to the first and second embodiments in terms of being trench-gate type. Furthermore, except for structure of an N⁻ field dispersion region 311, other structure of it is same as the second embodiment.

There will be described an N⁻ field dispersion region 311 of the high withstand voltage field effect type semiconductor device of this embodiment. An N⁻ field dispersion region 311 is formed continuously in vertical direction in FIG. 10. In this point, this embodiment is similar to the first embodiment. However, an N⁻ field dispersion region 311 of this embodiment formed extending to bottom portions of gate electrodes 306 and gate dielectrics 305. Therefore, an N⁻ field dispersion region 311 is formed continuously extending to wide range in the semiconductor substrate.

The high withstand voltage field effect type semiconductor device of this embodiment is realized as follows. That is, an N-field dispersion region 311 is formed a little bit thickly or trenches of gate electrodes 306 are formed a little bit shallowly in manufacturing process of the first and second embodiments.

The above such structured high withstand voltage field effect type semiconductor device directed to the present embodiment has another effect in addition to effect obtained with the device of the first embodiment. That is, bottoms of gate electrodes 306 are covered with an N⁻ field dispersion region 311. Accordingly, bottoms of gate electrodes 306 are covered with a depletion layer soon after switch-OFF. Therefore, withstand-ability against voltage is high at a portion between a gate electrode 306 and a collector electrode 310. That is, the high withstand voltage field effect type semiconductor device of the present embodiment exhibits high withstand-ability against voltage at gate-collector as well as collector-emitter.

Needless to say, in the high withstand voltage field effect type semiconductor device directed to the present embodiment, N⁻ field dispersion regions 311 and N⁺ emitter regions 304 may be arranged discretely in vertical direction in FIG. 10, similar to the second embodiment, thereby to suppress rise of ON-voltage. Furthermore, an N⁻ field dispersion region 311 is not always required to cover whole bottom of gate electrodes 306. Some extent of high withstand-ability against voltage is achieved as long as at least shoulder portions of gate electrodes 306 are covered. Shoulder portions are portions where electric field concentrates. Therefore, if these portions are included in a field dispersion region, withstand-ability against voltage is enhanced effectively by relaxing of electric field.

[Fourth Embodiment]

Figure 15:
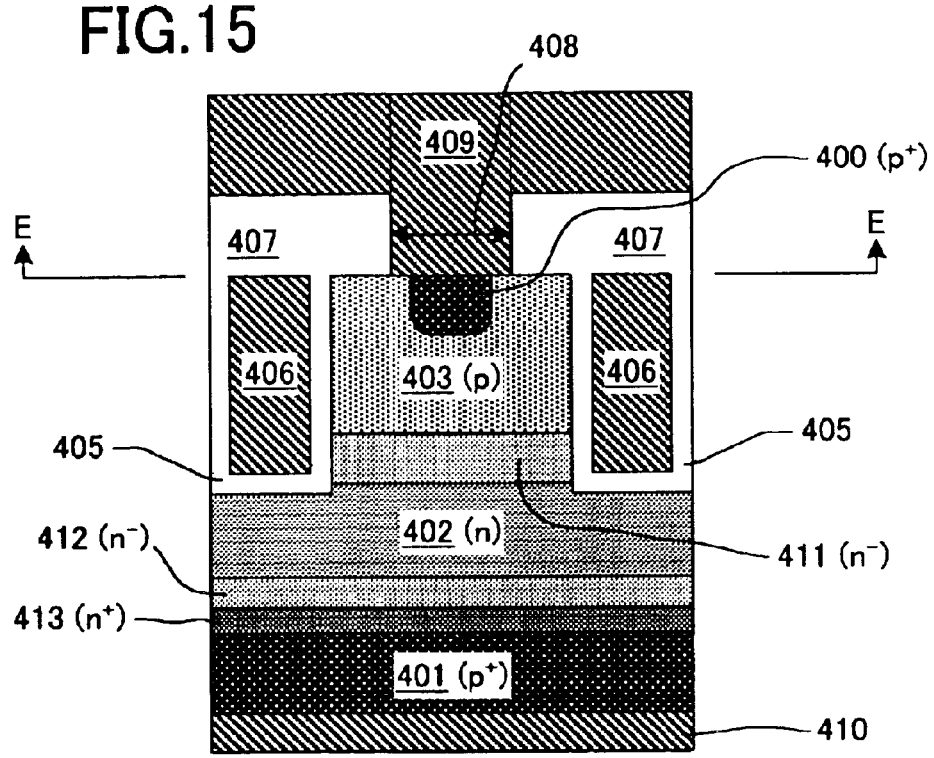
FIG. 15 is an elevation sectional view (a portion A—A) showing structure of a field effect type semiconductor device directed to a fourth embodiment.
Figure 16:
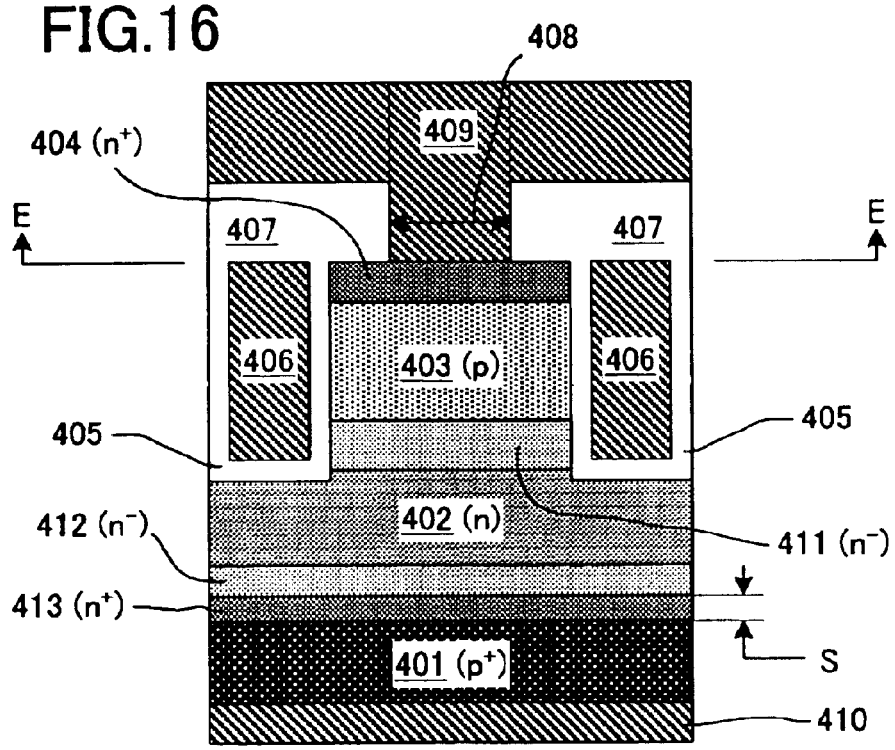
FIG. 16 is an elevation sectional view (a portion B—B) showing structure of the field effect type semiconductor device directed to the fourth embodiment.

FIG. 15 and FIG. 16 show structure of a high withstand voltage field effect type semiconductor device directed to a fourth embodiment. The sectional view of the portion E—E in FIG. 15 and FIG. 16 is substantially same as FIG. 10 for the second embodiment of which numberings are changed from "2" to "4". Hereinafter, numberings should be interpreted like that when FIG. 10 is referred in this embodiment. FIG. 15 shows a sectional view of a portion A—A in FIG. 10. FIG. 16 shows a sectional view of a portion B—B in FIG. 10. The high withstand voltage field effect type semiconductor device of this embodiment is common to the first through third embodiments in terms of being trench-gate type. Furthermore, except for collector-side structure, other structure of it is same as the second embodiment.

There will be described the collector-side structure of the high withstand voltage field effect type semiconductor device directed to the present embodiment. In the high withstand voltage field effect type semiconductor device of the present embodiment, an N⁻ second field dispersion region 412 and an N⁺ buffer region 413 are arranged between an N drift region 402 and a P⁺ collector region 401. The N⁻ second field dispersion region 412 is in contact with the N drift region 402 and the N⁺ buffer region 413 is in contact with the P⁺ collector region 401. Impurity concentration at the N⁻ second field dispersion region 412 is same as or lower than 80% of impurity concentration at the N drift region 402. Impurity concentration at the N⁻ second field dispersion region 412 may be low as so-called i-type, but should not be P-type. Impurity concentration at the N⁺ buffer region 413 is same as or lower than ½ of impurity concentration at the P⁺ collector region 401, however should be higher than impurity concentration at the N drift region 402.

Furthermore, thickness S of the N⁺ buffer region 413 should be same as or thinner than dispersion length L of holes as minor carriers. Dispersion length L can be expressed as below.

$$L=(Dp*\tau)^{1/2}$$

"τ" represents life time of a whole. "Dp" represents a dispersion coefficient and is expressed as below.

$$Dp=(k*t/q)\mu p$$

"k" represents Boltzmann's constant, "t" represents temperature (absolute temperature), "q" represents charge of an electron, and "μp" represents mobility of a hole.

Furthermore, in the high withstand voltage field effect type semiconductor device of the present embodiment, there is required for "αnpn" and "αpnp", amplification factor of a parasitic bipolar transistor base of which is a P body region 403, and that of a parasitic bipolar transistor base of which is an N drift region 402, respectively, to have the following relationship.

$$\alpha npn+\alpha pnp<1$$

The above relationship is required to avoid latch-up. The relationship can be achieved by adjusting thickness of the N⁻ second field dispersion region 412.

In case of structure such that an N⁻ second field dispersion region 412 exists but no N⁻ field dispersion region 411, device destruction is likely to occur after switch-OFF. This is because "αnpn+αpnp" exceeds "1" due to avalanche breakdown and the device falls into uncontrollable state due to latch-up. However, in the high withstand voltage field effect type semiconductor device of the present embodiment, the N⁻ field dispersion region 411 relaxes electric field between P body regions 403 and the N drift region 402. Therefore, the above such trouble will not occur.

The high withstand voltage field effect type semiconductor device of this embodiment is realized as follows. That is, in manufacturing process of the first and second embodiments, an N-type silicon of high impurity concentration, that of low impurity concentration, and that of medium impurity concentration may be formed in this order on a P$^+$ silicon wafer as start substrate by epitaxial growth, to regard them as an N$^+$ buffer region 413, an N$^-$ second field dispersion region 412, and an N drift region 402, respectively. As to an N$^-$ second field dispersion region 411 and the like, they may be formed in a manner of epitaxial growth or modifying a part of an N drift region 402 by ion implantation.

The above such structured high withstand voltage field effect type semiconductor device directed to the present embodiment has another effect in addition to effect obtained with the device of the first embodiment. That is, turn-OFF time after switch-OFF is shorter for following reason. Depletion layer extends from PN junction between P body regions 403 and N$^-$ field dispersion regions 411 after switch-OFF. Since an N$^-$ second field dispersion region 412 is arranged between an N drift region 402 and an N$^+$ buffer region 413, depletion layer is likely to extend even when reaching termination of extension. As a result, depletion layer extends to the extent that the entirety of the N$^-$ second field dispersion region 412 gets depleted. Therefore, carriers remaining after switch-OFF are rapidly emitted to emitter side or collector side.

In the high withstand voltage field effect type semiconductor device of the present embodiment, temperature characteristic of ON-voltage is always positive. This derives from aspects that impurity concentration at an N$^+$ buffer region 413 is same as or lower than ½ of impurity concentration at the P$^+$ collector region 401, and thickness S of an N$^+$ buffer region 413 is same as or thinner than dispersion length L of minor carrier. With above such conditions, holes of the P$^+$ collector region 401 are quite efficiently injected to the N drift region 402 even if collector-emitter voltage is low. Thereby, conductivity modulation is likely to occur even under a low current condition efficiently regardless temperature is low or high. On the other hand, mobility of carriers decrease as temperature rises under a large current condition, due to a factor such as scattering of carriers or the like. Therefore, temperature coefficient of ON voltage is positive. That is, there can be obtained positive temperature characteristic wherein ON-voltage rises along with rise of temperature. Under such effect, self-control of temperature balance works among a plurality of devices connected in parallel. Thereby, temperatures of those devices are kept uniform and device destruction due to abnormal heating is avoided.

Figure 17:
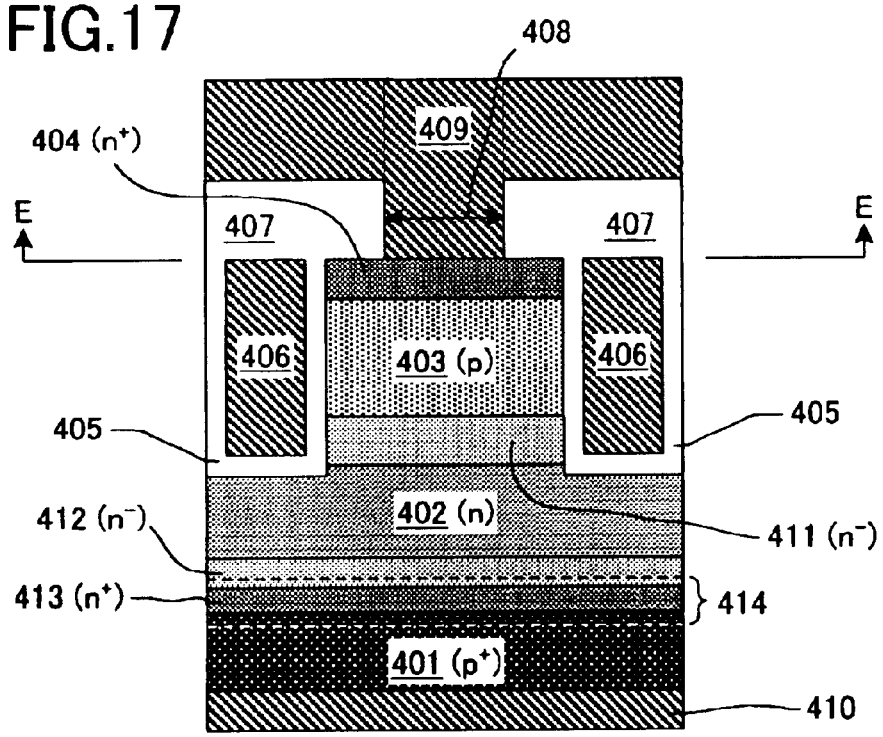
FIG. 17 is an elevation sectional view (a portion B—B) showing structure of a variant of the field-effect-type semiconductor device directed to the fourth embodiment.

Furthermore, the high withstand voltage field effect type semiconductor device of the present embodiment may have a defect region 414 formed including the N$^+$ buffer region 413, as shown in FIG. 17. FIG. 17 is a cross sectional view of a portion B—B in FIG. 10. The defect region 414 is formed similarly also at a portion A—A. The defect region 414 is a region in which high concentration of lattice defects distributes. In the defect region 414, a life time of minor carrier is short in comparison with a region of no lattice defect. This is because deep level of lattice defects accelerates recombination of an electron and a hole. Therefore, turn-OFF time is further short. This region is formed by irradiating charged particles such as electrons and then, annealing under temperature higher than 300° C. Depth, thickness, and lattice defect concentration of to-be-formed defect region 414 can be controlled by adjusting acceleration voltage at the time of irradiating charged particles, irradiation quantity, and other condition. Lattice defect concentration of the defect region 414 should be set to the extent that a life time of carrier therein is same as or lower than ¼ of a case that lattice defect does not distribute in the defect region 414.

Thereby, there can be obtained a high withstand voltage field effect type semiconductor device of which turn-OFF time after switch-OFF is further shortened. This is because holes as minor carriers in the N$^+$ buffer region 413 extinct promptly after switch-OFF.

Similar to the second embodiment, in the high withstand voltage field effect type semiconductor device of the present embodiment, N$^-$ field dispersion regions 411 and N$^+$ emitter regions 404 may be discretely arranged in vertical direction in FIG. 10 so as to suppress rise of ON-voltage. Furthermore, similar to the third embodiment, the present embodiment may be structured such that an N$^-$ field dispersion region 411 covers bottom surfaces of gate electrodes 406. Furthermore, the present embodiment does not have to have an N$^+$ buffer region 413. Even if no N$^+$ buffer region 413 is provided, turn-OFF time can be shortened by arranging a defect region around the interface of the P$^+$ collector region 401 and the N$^-$ second field dispersion region 412.

[Fifth Embodiment]

Figure 18:
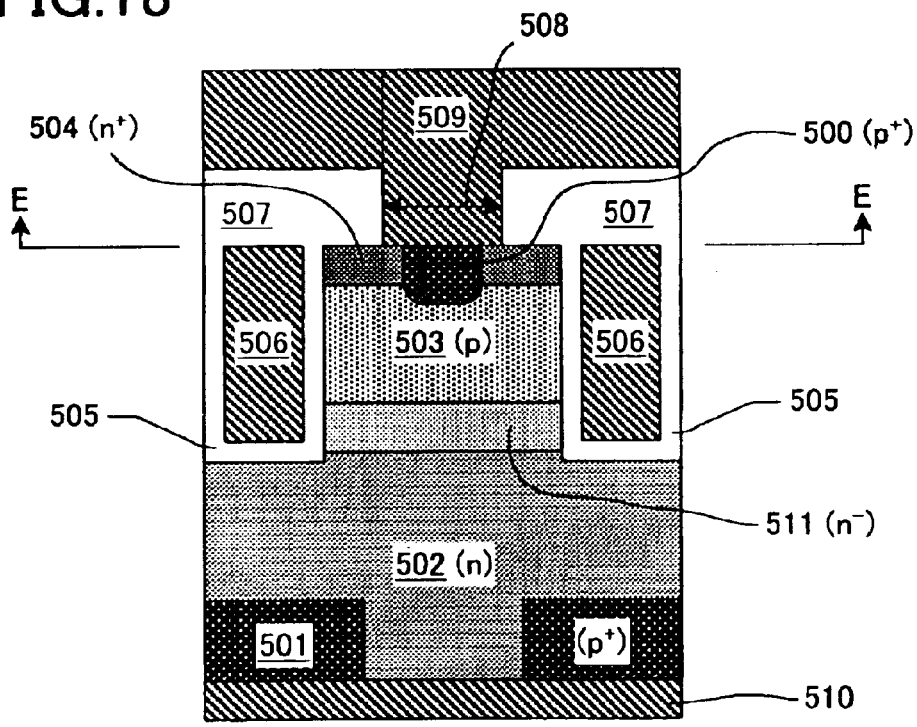
FIG. 18 is an elevation sectional view (a portion B—B) showing structure of a field effect type semiconductor device directed to a fifth embodiment.

FIG. 18 shows structure of a high withstand voltage field effect type semiconductor device directed to a fifth embodiment. The sectional view of the portion E—E in FIG. 18 is substantially same as FIG. 1 for the first embodiment of which numberings are changed from "1" to "5". Hereinafter, numberings should be interpreted like that when FIG. 1 is referred in this embodiment. FIG. 18 shows a sectional view of a portion A—A in FIG. 1. The high withstand voltage field effect type semiconductor device of this embodiment is common to the foregoing embodiments in terms of being trench-gate type. Furthermore, except for structure of a P$^+$ collector region 501, other structure of it is same as the first embodiment. Although FIG. 18 is the cross sectional view of the portion A—A, structure of the P$^+$ collector region 501 at the portion B—B is same as at the portion A—A.

There will be described a P$^+$ collector region 501 of the high withstand voltage field effect type semiconductor device directed to the present embodiment. The P$^+$ collector region 501 of the present embodiment is arranged insularly. The N drift region and the collector electrode 501 are in contact with each other directly at portions of no P$^+$ collector region 501. That is, this embodiment is a collector-short-circuited-type variant of the first embodiment. Even such a variant can enhance voltage withstand-ability due to electric field dispersion effect of the N$^-$ field dispersion region 511.

A P$^+$ collector region 501 can be formed such that an N-type silicon wafer is prepared as a start substrate and ion implantation is made on its bottom surface through appropriate pattern mask. As to structure of an N$^-$ field dispersion region 511 and structure above of the N$^-$ field dispersion region 511 can be formed following manufacturing method described in respective embodiments.

Figure 19:
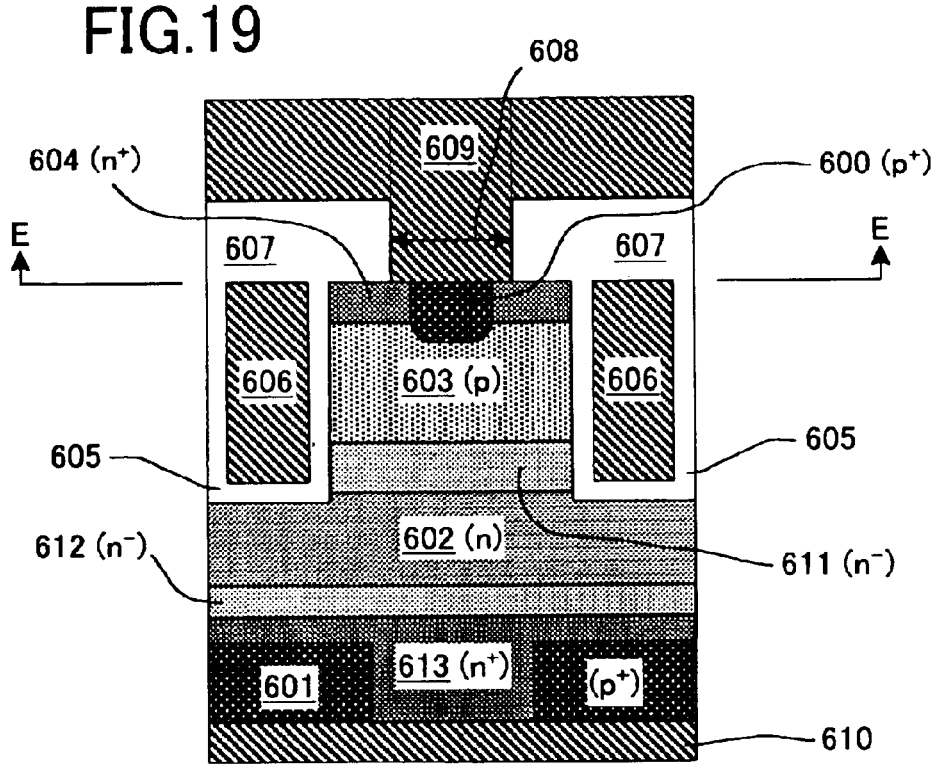
FIG. 19 is an elevation sectional view (a portion B—B) showing structure of a variant of the field-effect-type semiconductor device directed to the fifth embodiment.

Not to mention, a field effect type semiconductor device of collector-short-circuited-type can be provided with an N$^-$ second field dispersion region 612 and an N$^+$ buffer region 613, as shown in FIG. 19. In this case, it is an N$^+$ buffer region 613 that is in contact with the collector electrode 610 directly at a portion that includes no P$^+$ collector region 601.

Structure without an N⁺ buffer region 613 is feasible for the device of FIG. 19. In this case, it is an N⁻ second field dispersion region 612 that is in contact with the collector electrode 610 directly at a portion that includes no P⁺ collector region 601. Even such structured high withstand voltage field effect type semiconductor devices can obtain an effect of shortening turn-off time by an N⁻ second field dispersion region 612 in addition to an effect of enhancing voltage withstand-ability by an N⁻ field dispersion region 611. Furthermore, by appropriately setting impurity concentration and thickness of an N⁺ buffer region 613, there can be obtained an effect that temperature characteristic of ON-voltage is always positive.

Not to mention, in the high withstand voltage field effect type semiconductor device of the present embodiment, N⁻ field dispersion regions 511, 611 and N⁺ emitter regions 504, 604 may be arranged discretely like the second embodiment, thereby to suppress rise of ON-voltage. Furthermore, N⁻ field dispersion regions 511, 611 may be arranged to cover bottom surfaces of gate electrodes 506, 606 like the third embodiment. Furthermore, in case the device is provided with an N⁺ buffer region 613 like FIG. 19, there may be arranged a defect region that includes the N⁺ buffer region 613.

The above described embodiments are provided for mere illustrative purpose, and the present invention is not limited thereto. Of course, various modifications or variations can occur without departing the spirit of the invention.

For example, a third and fourth N⁻ field dispersion regions may be arranged between an N⁻ field dispersion region *11 ("*" is an arbitrary natural number within 1 through 6, hereinafter also) at P body side and an N⁻ second field dispersion region *12 at collector side. Thereby, withstand-ability against voltage of collector-emitter can be enhanced further. As to devices without an N⁻ second field dispersion region *12 (directed to first through third embodiments, and FIG. 18 of the fifth embodiment), there may be arranged an N⁺ buffer region that is in contact with P⁺ collector region *01. Furthermore, impurity concentration at an N drift region *02 is not required to be uniform. Furthermore, the present invention is applicable to different types of field effect type semiconductor device, such as MOS control thyristor and the like. Above all, the device of first through third embodiments is applicable to power MOS.

Furthermore, as to semiconductor regions other than gate electrodes *06, conduction types, i.e. P-type and N-type, may be inverted. Gate electrodes *06 may be replaced with a P-type semiconductor or metal separately from other semiconductor regions. Dielectric films at respective portions are not restricted to oxide film. They may be other types of dielectric film such as nitride film or may be complex film. Semiconductor material is not restricted to silicon but it may be other kinds of semiconductor (SiC, GaN, GaAs, and the like). Furthermore, plane geometry shape of gate electrodes *06 may be circle, ellipse, other polygon, and the like. Type of the semiconductor device is not restricted to trench-type but may be planer-type or concave-type.

As apparent from the above description, according to the present invention, there is provided a high withstand voltage field effect type semiconductor device that relaxes electric fields in a semiconductor substrate without thickening thickness of a drift region and achieves withstand-ability against high voltage without sacrificing ON-voltage, switch-OFF characteristics, and miniaturization.

What is claimed is:

1. A high withstand voltage field effect type semiconductor device comprising:
    a body region arranged in a semiconductor substrate;
    a gate electrode facing to the body region;
    a drift region arranged below the body region in the semiconductor substrate, the drift region having a conduction type opposite to that of the body region;
    a field dispersion region arranged between the body region and the drift region, the field dispersion region having a conduction type which is the same as that of the drift region and having a low net impurity concentration; and
    emitter regions arranged discretely at an opposite side of the drift regions, with the body region arranged between the emitter regions and the drift region, the emitter regions having a conduction type opposite to that of the body region; and
    wherein field dispersion regions are arranged discretely corresponding to the emitter regions.

2. A high withstand voltage field effect type semiconductor device according to claim 1 further comprising:
    a buffer region arranged at an opposite side of the body region with the drift region arranged between the buffer region and the body region, the buffer region having a same conduction type as the drift region; and
    a second field dispersion region arranged between the drift region and the buffer region, the second field dispersion region having a same conduction type as the drift region and having a low net impurity concentration.

3. A high withstand voltage field effect type semiconductor device according to claim 2,
    wherein a thickness of the buffer region is smaller than a dispersion length of minority carrier.

4. A high withstand voltage field effect type semiconductor device according to claim 2:
    further comprising a collector region arranged at an opposite side of the drift region with the buffer region arranged between the collector region and the drift region, the collector region having an opposite conduction type to that of the drift region; and
    wherein a net impurity concentration of the buffer region is the same as or lower than half of a net impurity concentration of the collector region.

5. A high withstand voltage field effect type semiconductor device according to claim 4,
    wherein a thickness of the buffer region is smaller than a dispersion length of minority carrier.

6. A high withstand voltage field effect type semiconductor device comprising:
    a body region arranged in a semiconductor substrate;
    a gate electrode facing to the body region;
    a drift region arranged below the body region in the semiconductor substrate, the drift region having a conduction type opposite to that of the body region;
    a field dispersion region arranged between the body region and the drift region, the field dispersion region having a conduction type which is the same as that of the drift region and having a low net impurity concentration; and
    emitter regions arranged discretely at an opposite side of the drift regions, with the body region arranged between the emitter regions and the drift region, the emitter regions having a conduction type opposite to that of the body region, wherein field dispersion regions are arranged discretely corresponding to the emitter regions;

wherein the gate electrode is trench-structured; and wherein the field dispersion region is formed extending to a bottom of the gate electrode.

7. A high withstand voltage field effect type semiconductor device according to claim 6 further comprising:

a buffer region arranged at an opposite side of the body region with the drift region arranged between the buffer region and the body region, the buffer region having a same conduction type as the drift region; and a second field dispersion region arranged between the drift region and the buffer region, the second field dispersion region having a same conduction type as the drift region and having a low net impurity concentration.

8. A high withstand voltage field effect type semiconductor device according to claim 7:

further comprising a collector region arranged at opposite side of the drift region with the buffer region arranged between the collector region and the drift region, the collector region having an opposite conduction type to that of the drift region; and wherein a net impurity concentration of the buffer region is the same as or lower than half of a net impurity concentration of the collector region.

9. A high withstand voltage field effect type semiconductor device comprising:

a body region arranged in a semiconductor substrate;

a gate electrode facing to the body region;

a drift region arranged below the body region in the semiconductor substrate, the drift region having a conduction type opposite to that of the body region;

a field dispersion region arranged between the body region and the drift region, the field dispersion region having a conduction type which is the same as that of the drift region and having a low net impurity concentration;

a buffer region arranged at an opposite side of the body region with the drift region arranged between the buffer region and the body region, the buffer region having a same conduction type as the drift region; and a second field dispersion region arranged between the drift region and the buffer region, the second field dispersion region having a same conduction type as the drift region and having a low net impurity concentration.

10. A high withstand voltage field effect type semiconductor device according to claim 9, wherein a thickness of the buffer region is smaller than a dispersion length of minority carrier.

11. A high withstand voltage field effect type semiconductor device according to claim 9, further comprising a carrier life time control region including at least the buffer region.

12. A high withstand voltage field effect type semiconductor device according to claim 9:

further comprising a collector region arranged at an opposite side of the drift region with the buffer region arranged between the collector region and the drift region, the collector region having an opposite conduction type as that of the drift region; and wherein a net impurity concentration of the buffer region is the same as or lower than half of a net impurity concentration of the collector region.

13. A high withstand voltage field effect type semiconductor device according to claim 12, wherein a thickness of the buffer region is smaller than a dispersion length of minority carrier.

14. A high withstand voltage field effect type semiconductor device comprising:

a body region arranged in a semiconductor substrate;

a gate electrode facing to the body region;

a drift region arranged below the body region in the semiconductor substrate, the drift region having a conduction type opposite to that of the body region;

a field dispersion region arranged between the body region and the drift region, the field dispersion region having a conduction type which is the same as that of the drift region and having a low net impurity concentration;

a buffer region arranged at an opposite side of the body region with the drift region arranged between the buffer region and the body region, the buffer region having a same conduction type as the drift region; and a second field dispersion region arranged between the drift region and the buffer region, the second field dispersion region having a same conduction type as the drift region and having a low net impurity concentration, wherein the gate electrode is trench-structured; and the field dispersion region is formed extending to bottom of the gate electrode.

15. A high withstand voltage field effect type semiconductor device according to claim 14, wherein a thickness of the buffer region is smaller than a dispersion length of minority carrier.

16. A high withstand voltage field effect type semiconductor device according to claim 14:

further comprising a collector region arranged at opposite side of the drift region with the buffer region arranged between the collector region and the drift region, the collector region having an opposite conduction type to that of the drift region; and wherein a net impurity concentration of the buffer region is the same as or lower than half of a net impurity concentration of the collector region.

17. A high withstand voltage field effect type semiconductor device according to claim 16, wherein a thickness of the buffer region is smaller than a dispersion length of minority carrier.

* * * * *

UNITED STATES PATENT AND TRADEMARK OFFICE
CERTIFICATE OF CORRECTION

PATENT NO.     : 6,921,941 B2
DATED          : July 26, 2005
INVENTOR(S)    : Katsuhiko Nishiwaki et al.

It is certified that error appears in the above-identified patent and that said Letters Patent is hereby corrected as shown below:

Column 14,
Lines 16 and 66, "regions, with" should read -- region, with --.

Signed and Sealed this

Eleventh Day of October, 2005

JON W. DUDAS
*Director of the United States Patent and Trademark Office*